United States Patent
Hake et al.

(10) Patent No.: US 11,711,902 B2
(45) Date of Patent: Jul. 25, 2023

(54) RACKMOUNT SYSTEMS AND METHODS

(71) Applicant: GE INFRASTRUCTURE TECHNOLOGY LLC, Greenville, SC (US)

(72) Inventors: Mariah Inez Hake, Broomfield, CO (US); Mark Stefan Maier, Longmont, CO (US)

(73) Assignee: GE INFRASTRUCTURE TECHNOLOGY LLC, Greenville, SC (US)

( * ) Notice: Subject to any disclaimer, the term of this patent is extended or adjusted under 35 U.S.C. 154(b) by 0 days.

(21) Appl. No.: 17/645,545

(22) Filed: Dec. 22, 2021

(65) Prior Publication Data

US 2022/0225524 A1    Jul. 14, 2022

Related U.S. Application Data

(60) Provisional application No. 63/135,957, filed on Jan. 11, 2021.

(51) Int. Cl.
*H05K 7/14* (2006.01)

(52) U.S. Cl.
CPC ......... *H05K 7/1402* (2013.01); *H05K 7/1424* (2013.01); *H05K 7/1439* (2013.01)

(58) Field of Classification Search
None
See application file for complete search history.

(56) References Cited

U.S. PATENT DOCUMENTS

| | | | | | |
|---|---|---|---|---|---|
| 6,067,225 | A | * | 5/2000 | Reznikov | H05K 7/1418 |
| D556,204 | S | * | 11/2007 | Tosh | D14/439 |
| 2005/0281014 | A1 | * | 12/2005 | Carullo | H05K 7/1461 361/796 |
| 2008/0259554 | A1 | * | 10/2008 | Qin | G06F 1/187 361/679.34 |
| 2013/0120941 | A1 | * | 5/2013 | Peterson | H05K 7/1492 29/401.1 |
| 2014/0022723 | A1 | * | 1/2014 | Yang | G06F 1/187 361/679.37 |

* cited by examiner

*Primary Examiner* — James Wu
*Assistant Examiner* — Christopher L Augustin
(74) *Attorney, Agent, or Firm* — Armstrong Teasdale LLP

(57) ABSTRACT

Systems and methods for improved circuit board removal and/or reinstallation are provided. A circuit board removal system can include a frame including a channel arranged in a plate of the frame. A disengagement slider can include a mounting surface and a first portion including a first cam surface, where the disengagement slider is arranged within the frame. A separator can include a second cam surface and can be arranged in the channel of the plate. The first cam surface and the second cam surface can be nested with each other when the disengagement slider is in an inserted position. The disengagement slider can be configured to slide the separator in the longitudinal direction when the disengagement slider is removed from the frame due to the interaction of the first cam surface with the second cam surface.

20 Claims, 22 Drawing Sheets

RACKMOUNT SYSTEMS AND METHODS

CROSS-REFERENCE TO RELATED APPLICATIONS

This application claims priority to U.S. Provisional Patent Application No. 63/135,957 filed on Jan. 11, 2021, and entitled "Rackmount Systems and Methods," the disclosure of which is incorporated herein by reference in its entirety.

FIELD

The present invention relates generally to rackmount systems and methods of using the same for organizing items within a frame.

BACKGROUND

In some instances, existing control systems connect a series of printed circuit boards by mounting them each onto on a cabinet back panel and connecting them with custom daisy-chained serial cables, off-the-shelf serial cables, ethernet cables, and/or coaxial cables. This arrangement requires a large amount of space to be used due to each board being laid flat within the cabinet. Additionally, multiple cables are required to connect each board within the cabinet. In order to remove a circuit board from the cabinet, the cables are first disconnected, and then the circuit board unsecured from the wall of the cabinet, which is a time-consuming process. Also, a technician having knowledge of the correct placement of the cables can typically be required to be present to ensure a replacement board is installed correctly since multiple cables can be present within the cabinet.

SUMMARY

Embodiments of the present disclosure provide circuit board removal systems and corresponding methods that provide a space-saving arrangement of circuit boards.

In an embodiment, a system is provided and can include a frame including a channel arranged in a plate of the frame. A disengagement slider can include a mounting surface and a first portion including a first cam surface, where the disengagement slider is arranged within the frame. A separator can include a second cam surface and can be arranged in the channel of the plate. The first cam surface and the second cam surface can be nested with each other when the disengagement slider is in an inserted position. The disengagement slider can be configured to slide the separator in the longitudinal direction when the disengagement slider is removed from the frame due to the interaction of the first cam surface with the second cam surface.

In some embodiments, the first cam surface can include a first protrusion and a second protrusion spaced apart from the first protrusion. In other embodiments, a first linear surface can be arranged between the first and second protrusions. In some embodiments, the second cam surface can include a first indentation and a second indentation spaced apart from the first indentation. In other embodiments, a second linear surface can be arranged between the first and second indentations.

In some embodiments, in an inserted position, the first projection of the disengagement slider can be arranged within the first indentation of the separator, the second projection of the disengagement slider can be arranged within the second indentation of the separator, and the second linear surface of the separator can be aligned with the first linear surface of the disengagement slider. In other embodiments, in a removed position, the first cam surface can be configured to slide along the second cam surface in a removal direction, and the first projection of the disengagement slider can be configured to contact the second linear surface of the separator.

In some embodiments, when the first projection of the disengagement slider contacts the second linear surface of the separator, the separator can be configured to contact and move a plurality of disengagement sliders and separators arranged on the opposite side of the separator from the disengagement slider in the longitudinal direction within the frame.

In some embodiments, the system can further comprise a printed circuit board including a first connector arranged on a first side of the printed circuit board and a second connector arranged on a second side of the printed circuit board, where the printed circuit board can be mounted to a baseplate, where the baseplate can be mounted to the mounting surface of the disengagement slider. In other embodiments, the baseplate can include a tab arranged within a slot of the disengagement slider, and the tab can abut the disengagement slider within the slot when the disengagement slider is pulled in a removal direction.

In some embodiments, a plurality of printed circuit boards can be each arranged on the plurality of disengagement sliders. In the inserted position, the plurality of printed circuit boards are communicatively connected to each other via the first connectors securing to adjacent second connectors of adjacent printed circuit boards. In the removed position, the printed circuit board can be arranged on the disengagement slider being slid in the removal direction disconnects from adjacent printed circuit boards while the remaining plurality of printed circuit boards remain communicatively connected with each other via the first and second connectors.

In some embodiments, a method of circuit board removal is provided. The method can include sliding a disengagement slider in a removal direction out of a frame, where the disengagement slider includes a first cam surface. The method can further include sliding a separator in a longitudinal direction within the frame, where the separator includes a second cam surface. The first cam surface and the second cam surface can be nested with each other when the disengagement slider is in an inserted position. The disengagement slider can be configured to slide the separator in the longitudinal direction when the disengagement slider is slid in the removal direction due to the interaction of the first cam surface with the second cam surface.

In some embodiments, the method can further comprise decoupling a connector of a printed circuit board arranged on the disengagement slider when the separator is slid in the longitudinal direction.

In some embodiments, the first cam surface can include a first protrusion, a second protrusion, and a first linear surface arranged between the first and second protrusions. In other embodiments, the second cam surface can include a first indentation, a second indentation, and a second linear surface arranged between the first and second indentations.

In some embodiments, in an inserted position, the first projection of the disengagement slider can be arranged within the first indentation of the separator, the second projection of the disengagement slider can be arranged within the second indentation of the separator, and the second linear surface of the separator can be aligned with the first linear surface of the disengagement slider. In other embodiments, in a removed position, the first cam surface can be configured to slide along the second cam surface in a removal direction, and the first projection of the disengagement slider can be configured to contact the second linear surface of the separator.

In some embodiments, when the first projection of the disengagement slider contacts the second linear surface of the separator, the separator can be configured to contact and move a plurality of disengagement sliders and separators arranged on the opposite side of the separator from the disengagement slider in the longitudinal direction within the frame.

In some embodiments, the baseplate can include a tab arranged within a slot of the disengagement slider. In other embodiments, the tab can abut the disengagement slider within the slot when the disengagement slider is pulled in a removal direction.

In some embodiments, the method can further include sliding the disengagement slider in an installation direction into the frame, where the installation direction is opposite the removal direction, pivoting a compression handle in order to abut an adjacent disengagement slider or an adjacent separator, and sliding the separator in a second longitudinal direction within the frame, where the second longitudinal direction is opposite the first longitudinal direction.

DESCRIPTION OF DRAWINGS

These and other features will be more readily understood from the following detailed description taken in conjunction with the accompanying drawings, in which.

It is noted that the drawings are not necessarily to scale. The drawings are intended to depict only typical aspects of the subject matter disclosed herein, and therefore should not be considered as limiting the scope of the disclosure.

DETAILED DESCRIPTION

Mounting systems for printed circuit boards (PCBs) can be used to arrange the PCBs in an organized arrangement, such as securing the PCBs to the wall of a cabinet so each PCB can be accessed. In general, the characteristics of a cabinet mounted PCB system will lead to wasted space and the complexity of having various cables within the cabinet to connect each of the PCBs to one another. Accordingly, improved rackmount systems and methods for removing a PCB from a rackmount system are provided. The improved rackmount system can include stacked PCBs each secured within individual disengagement sliders, which allow for ease of removal of a single PCB from the rackmount system. As a result, such systems and methods employ a slider system that when the disengagement slider, which has the PCB mounted to a base plate arranged within the disengagement slider, is pulled in a removal direction, a cam surface of the disengagement slider will interact with cam surfaces of the frame and adjacent disengagement slider assemblies in order to disconnect the PCB from adjacent PCBs while leaving the remaining PCBs within the system connected and operating. The advantage of having stacked PCBs within a system reduces the footprint of the system as a whole. Additionally, by having the PCBs stacked in such a way that allows for simple removal or replacement while allowing the other PCBs in the system to remain functional increases the maintenance efficiency of the system.

Implementations of the present disclosure are primarily discussed in the context of PCBs such as input/output cards (IO cards), but can be used for any type of PCB or electronic device. However, it can be understood that implementations of the present disclosure can also be employed in mounting systems which can include stacked, flat objects, which can be stored within a frame.

Figure 1:
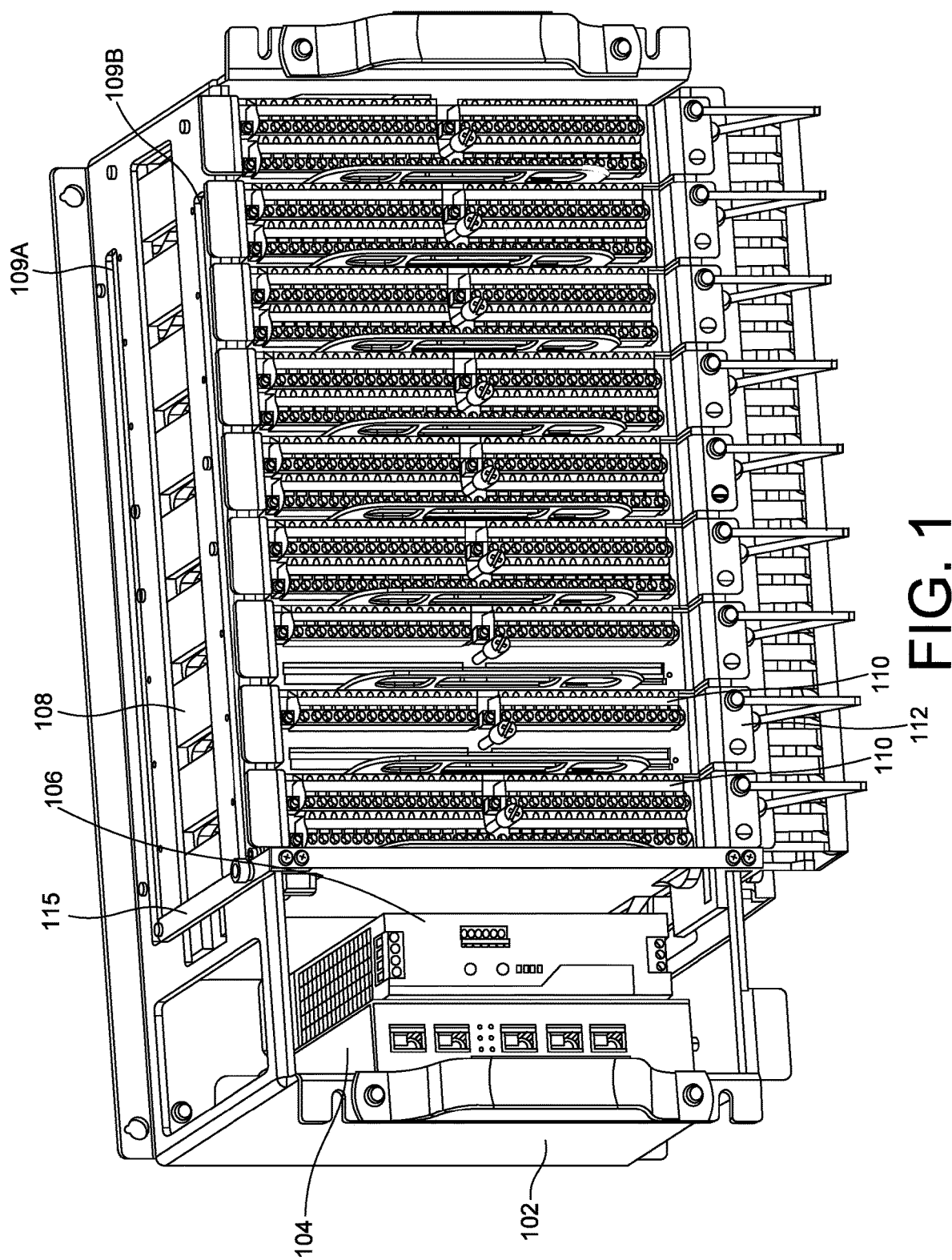
FIG. 1 is a perspective view illustrating one exemplary implementation of a rackmount system including printed circuit boards (PCBs)

FIG. 1 illustrates one exemplary implementation of a rackmount system 100 containing a frame 102. The single frame 102 can include all the components for a control system, or can be a subsystem of a larger system, where the frame is mounted in a larger mounting system. In an exemplary implementation, the frame 102 can be designed to hold various electrical components of a control system, such as a controller 104, a power supply 106, and a plurality of PCBs 110. The frame 102 can also hold terminal blocks, circuit breakers, fuses, network switches, or other control system equipment. The frame 102 can further include a top plate 108 and a bottom plate (not shown), including channels 109A and 109B, which can be used to secure PCBs 110 within the frame 102. In an exemplary implementation, the bottom plate can be identical to the top plate 108. In order to keep the PCBs 110 secured within the frame, a compression handle 115 is pivotally secured to the frame in order to keep the PCBs in a stacked configuration and prevent movement in the longitudinal direction along the X-axis. In an exemplary implementation, the compression handle 115 can be secured in a compressed state via pins, clips, captive screws, press-fit connections, spring plungers, or the like. Additionally, front plates 112 can be secured to the frame 102 to hold circuit board terminal blocks. In an exemplary implementation, the PCBs 110 can include pluggable (removable) terminal blocks that are used to wire additional equipment to the control system. The front plates 112 can allow the removal and reinstallation of the pluggable terminal blocks and wiring for a single PCB 110 at the same time for easier maintenance. The front plates 112 can also support functional earth grounding. In an exemplary implementation, the frame is made from a metallic material, but can be made from various other rigid materials such as plastic.

Figure 2:
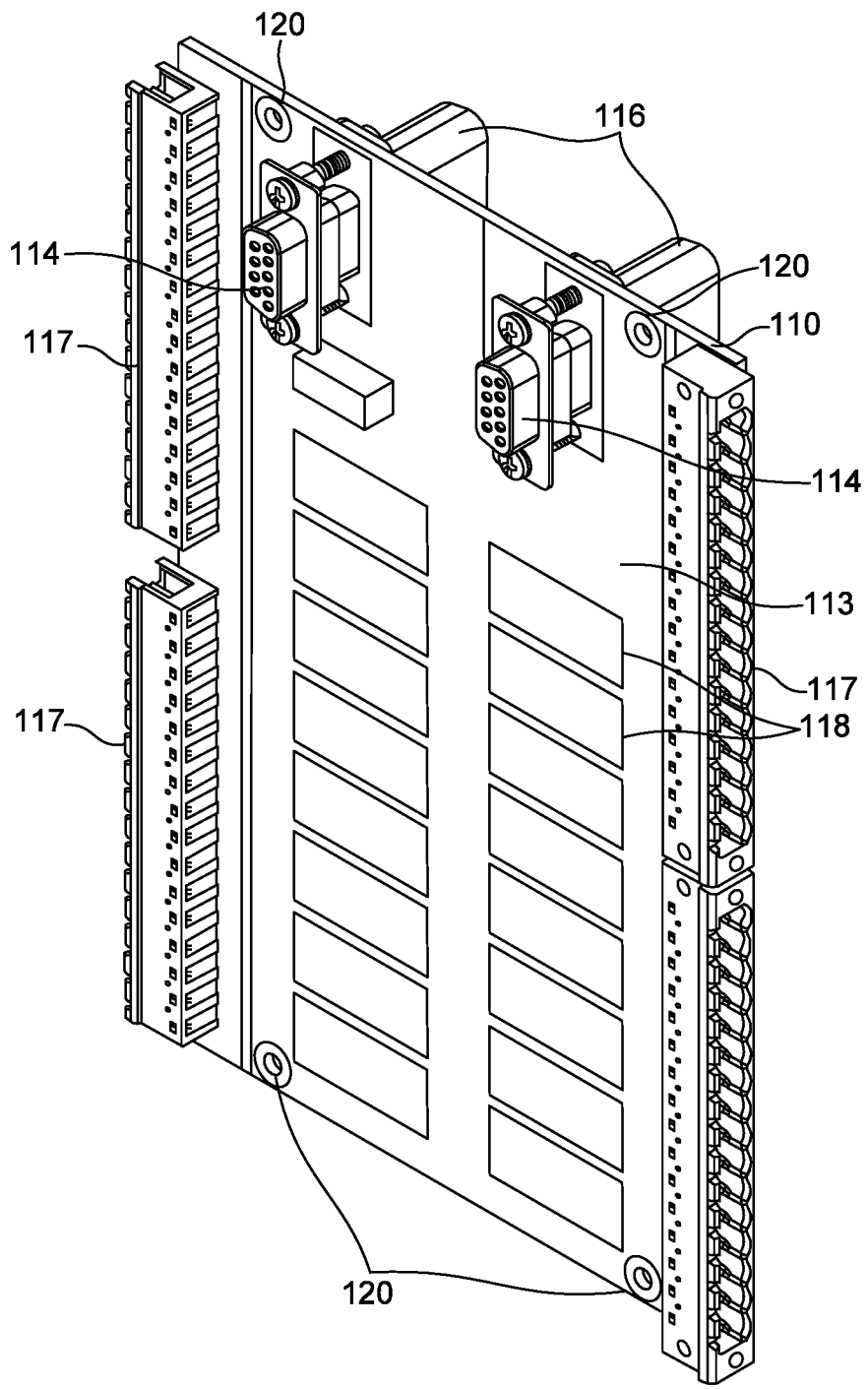
FIG. 2 is a perspective view illustrating one exemplary implementation of the PCBs of FIG. 1.

FIG. 2 illustrates one exemplary implementation of the PCBs 110 of FIG. 1. In an exemplary implementation, the PCB 110 can be an IO card for a control system. However, any type of PCB can be used within the rackmount system 100. The PCB 110 can include a board 113 having connectors 114 and connectors 116, which are arranged on the opposite side of the board 113. In an exemplary implementation, the connectors 114 and 116 can be different types of connectors. The arrangement of the connectors 114 and connectors 116 allows for the stacking configuration of the PCBs 110, as shown in FIG. 1. The stacking configuration of the PCBs 110 can allow for communicatively connecting and powering the PCBs 110 without the need of additional cables between each PCB 110. Additionally, the PCB 110 can include integrated circuits or microchips 118 arranged on the board 113. In order to secure the PCB 110 to a mounting surface, holes 120 are formed within the board 113.

Figure 3:
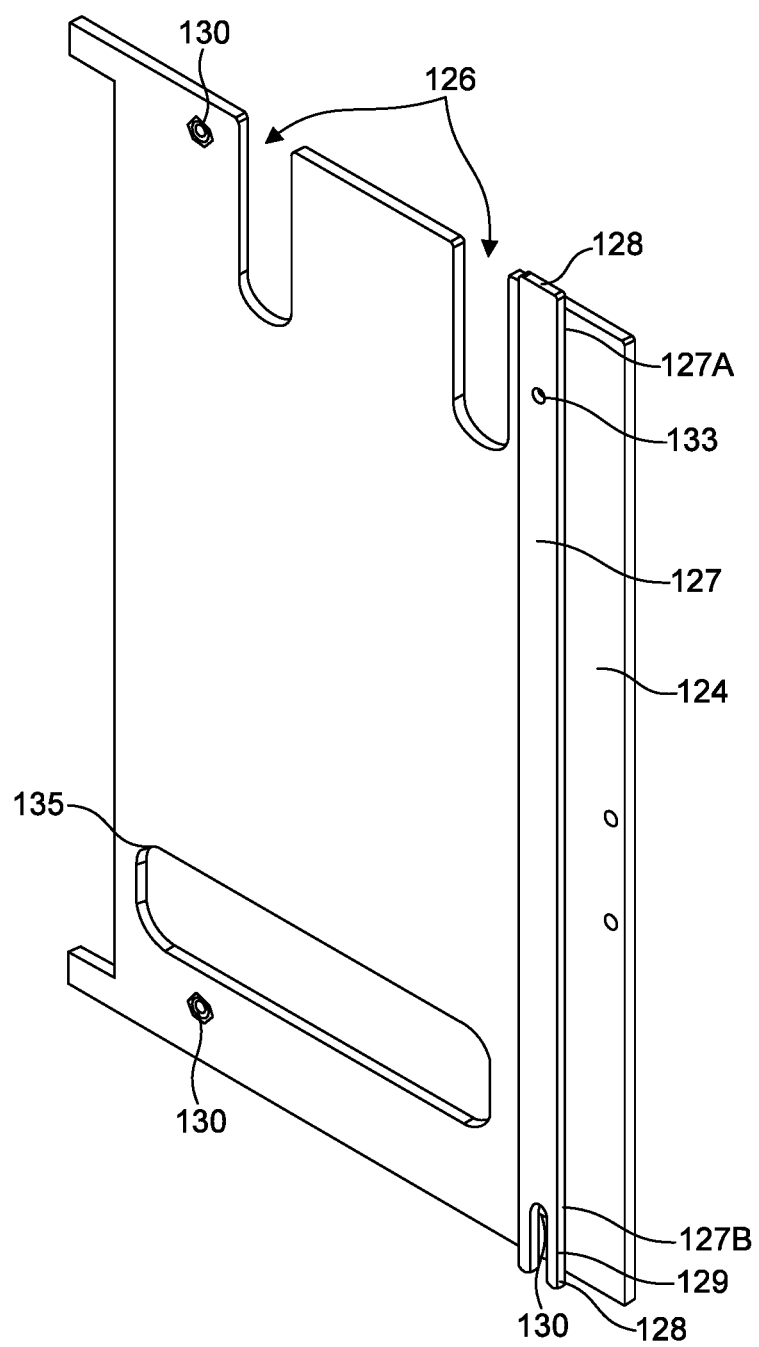
FIG. 3 is a perspective view illustrating one exemplary implementation of a base plate of the rackmount system of FIG. 1.

A base plate 122 can allow for the PCBs 110 to each be mounted to a single base plate 122. Due to the design of the base plate 122, any type of PCB 110 can be mounted to the base plate 122 and used within the rackmount system 100, regardless of the dimensions of the PCBs 110. FIG. 3 illustrates one exemplary implementation of a base plate 122 of the rackmount system 100 of FIG. 1. The base plate 122 can include a mounting surface 124 which a PCB 110 can be mounted to. In some implementations, the PCB 110 can be spaced away from the mounting surface 124 by spacers. The base plate 122 can also include slots 126, which can allow the connectors 114, 116 to pass through the base plate 122 to connect to adjacent PCBs 110. In order for the base plate 122 to interact with a disengagement slider assembly (described below), a bar 127 is secured to the base plate 122. The bar 127 includes a proximal end 127A and a distal end 127B. A tab 128 extends from both the proximal and distal ends 127A, 127B further than the edge of the base plate 122. A hole 133 is arranged on the proximal end 127A, which is configured to receive a bolt 127 to secure the bar 127 to the base plate 122. Additionally, a fork-end 129 is arranged at the distal end 127B and include a gap 130, which is configured to slid around the bolts 131 passing through the base plate 122 from the opposite side. The tabs 128 can extend further than the top surface of each side of the base plate 122 along the Y-axis. In an exemplary implementation, the base plate includes holes 130, which are aligned with the holes 120 of the PCB 110 to allow mounting of the PCB 110 to the base plate 122. In some embodiments, the base plate also includes an aperture 135 that is configured to allow access to terminals and connectors arranged on a PCB 110 secured to the base plate 122.

Figure 4A:
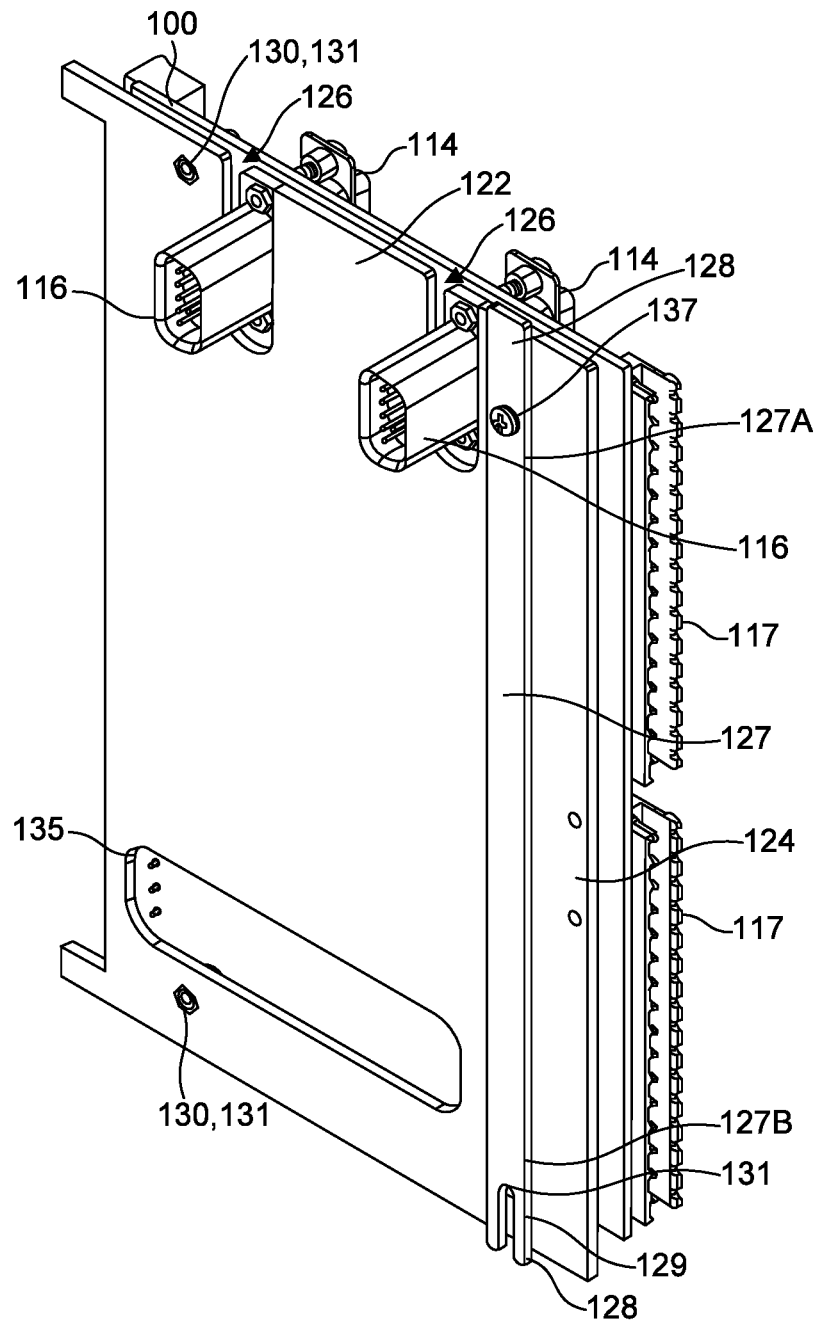
FIG. 4A is a perspective view illustrating a base plate assembly of the rackmount system of FIG. 1.
Figure 4B:
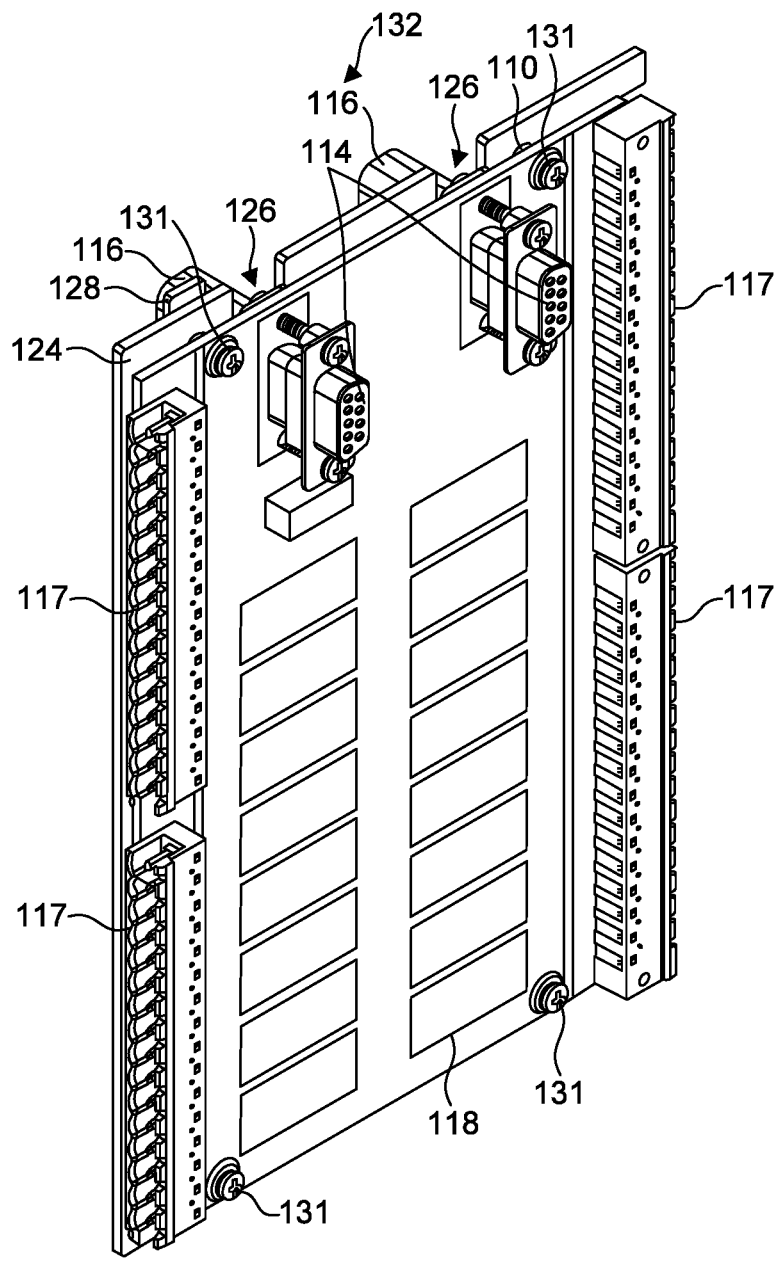
FIG. 4B is a perspective view illustrating the base plate assembly of FIG. 4A.

The base plate assembly 132 is formed from mounting a PCB 110 to the base plate 122. FIGS. 4A-4B illustrate a base plate assembly 132 of the rackmount system of FIG. 1. As depicted, the connectors 114, 116 are arranged within the slots 126 allowing for adjacent PCBs 110 to be connected to one another. The PCB 110 is secured to the base plate 122 by bolts 131, which are arranged within the holes 120 and 130. Additionally, in exemplary implementations, the PCB 110 can further include removable terminal blocks 117, which can allow for multiple cable connections between the PCBs 110 and other external components outside of the rackmount system 100. It should be appreciated that the PCBs 110 of the rackmount system 100 can be secured on either side of the base plates 122.

Figure 5A:
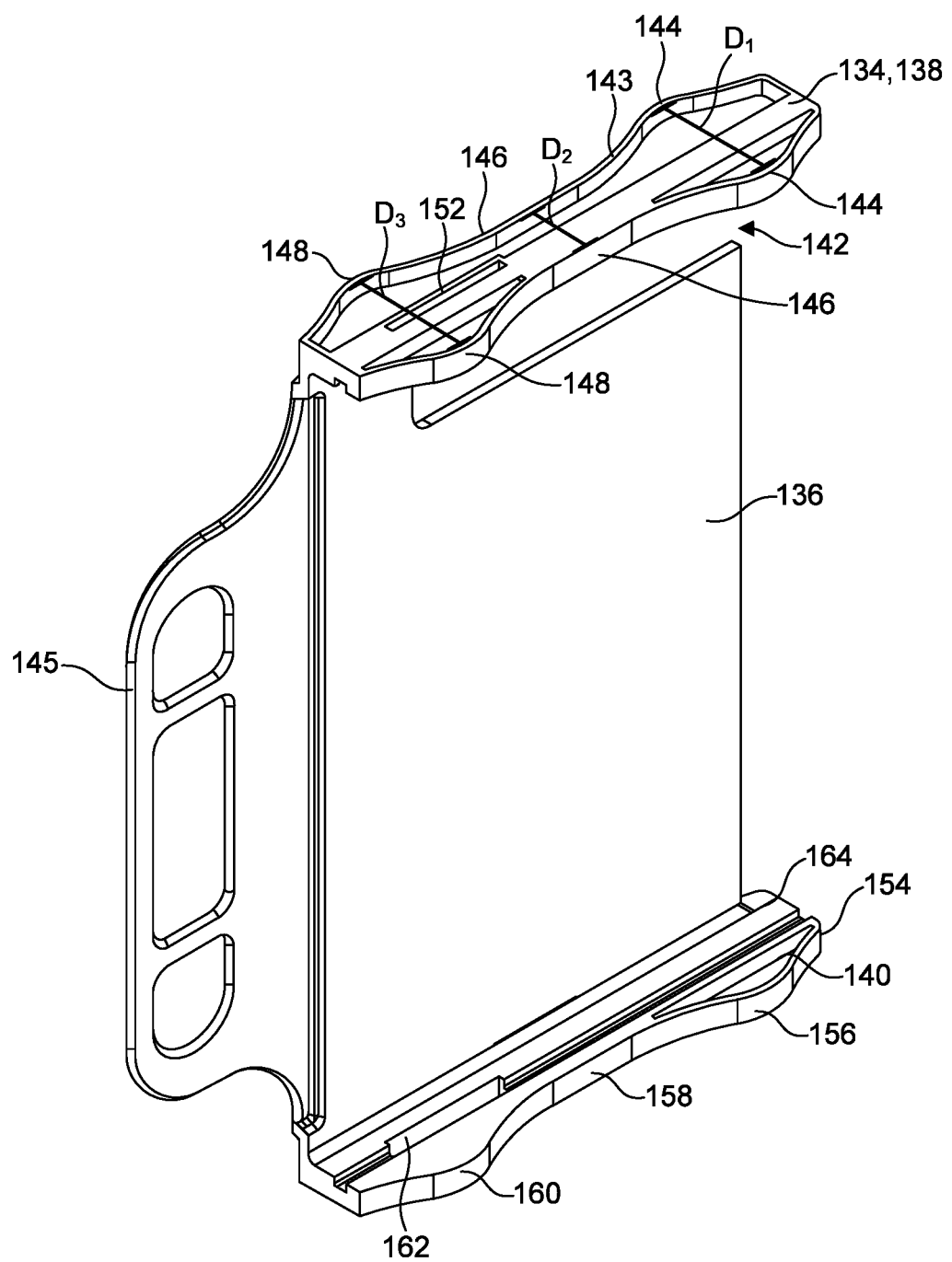
FIG. 5A is a perspective view illustrating one exemplary implementation of a disengagement slider of the rackmount system of FIG. 1.
Figure 5B:
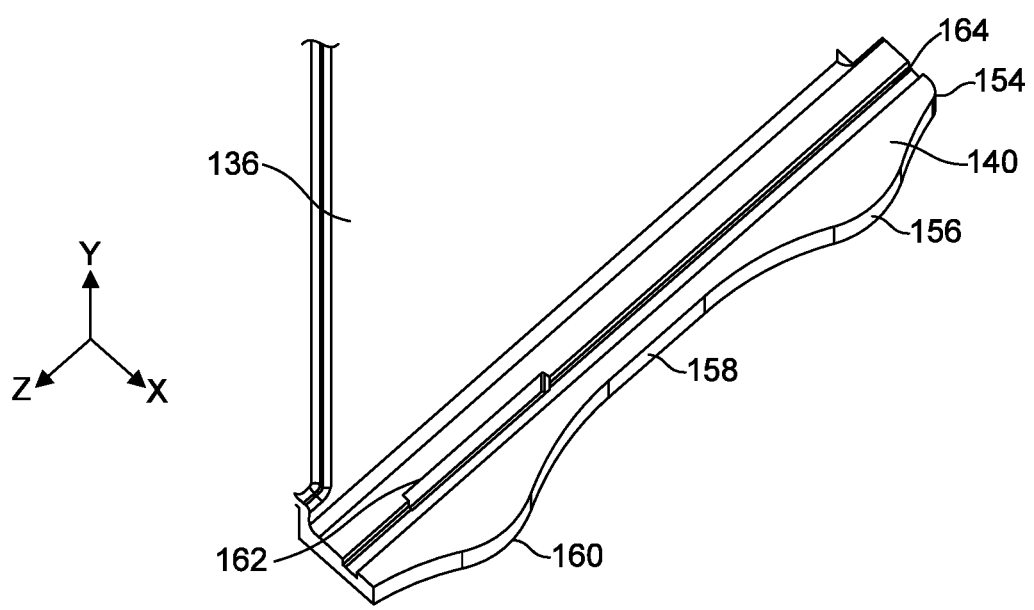
FIG. 5B is a perspective view illustrating the disengagement slider of FIG. 5A.

In order to be able to remove the PCBs 110 of the rackmount system 100 with ease, the PCBs 110 themselves are not permanently secured within the frame 102. The PCBs 110 are instead mounted within individual disengagement sliders 134, which allow the PCBs 110 to be slid out of the frame 102 in along the Z-axis. However, due to the stacked configuration of the PCBs 110, with adjacent connectors 114, 116 of each PCB 110 secured to each other, the sliding action of removing the PCB 110 from the frame 102 can also disconnect the connectors 114, 116 of the PCBs 110 adjacent to the PCB 110 being removed. FIGS. 5A-5B illustrates one exemplary implementation of a disengagement slider 134 of the rackmount system 100 of FIG. 1. The disengagement slider 134 can include a body 136, a top portion 138, and a bottom portion 140. In some implementations, the top portion 138 and the bottom portion 140 have a substantially similar shape, which is designed to disconnect connectors 114, 116 of adjacent PCBs 110 during removal of a PCB 110. The body 136 can extend between the top portion 138 and the bottom portion 140, and can include a slot 142 and a handle 145. The slot 142 can allow the connectors 114, 116 to pass through the disengagement slider 134 in order to connect with an adjacent PCB 110. The handle 134 can aid in pulling the disengagement slider 134 from the frame 102 during a removal process.

Further depicted in FIGS. 5A-5B, the top portion 138 can include a cam surface 143 and is generally of an hourglass shape. The cam surface 143 can include projections 144 and projections 148, which can be separated along the Z-axis. In-between the projections 144, 148 can be linear surfaces 146, which extend along the Z-axis. A distance of $D_1$ is formed between the projections 144, a distance of $D_2$ is formed between the surfaces 146, and a distance of $D_3$ is formed between the projections 148. In an exemplary implementation, the distances $D_1$ and $D_3$ are larger than the distance $D_2$. Additionally, the distances $D_1$ and $D_3$ can be substantially similar or identical. Similar to the top portion 138, the bottom portion 140 can include a cam surface 154 having projections 156 and 160, with liner surfaces 158 arranged in-between the projections 156, 158. In exemplary implementations, the projections 144 of the top portion 138 are aligned with the projections 156 of the bottom portion 140 along the Y-axis, the projections 148 of the top portion 138 are aligned with the projections 160 of the bottom portion 140 along the Y-axis, and the linear surfaces 146 of the top portions 138 are aligned with the linear surfaces 158 of the bottom portions 140 in the Y-axis. The location of the projections 144, 148, 156, 158 and surfaces 146, 158 allow for the disengagement slider to nest with adjacent separators (described below) when in an installed position, but allow cam surfaces 142, 154 to slide along a separator along the Z-axis in order to arrange the projections 144, 156 to disconnect the connectors 114, 116 of adjacent PCBs 110 during removal of a PCB 110. In addition to the projections and surfaces on the top portion 138, the top portion 138 also includes a slot 152 and a channel (not shown) arranged in the top portion 138 along the Z-axis. Additionally, the bottom portion 140 also includes a slot 162 and a channel 164 arranged in the bottom portion 140 along the Z-axis.

Figure 6A:
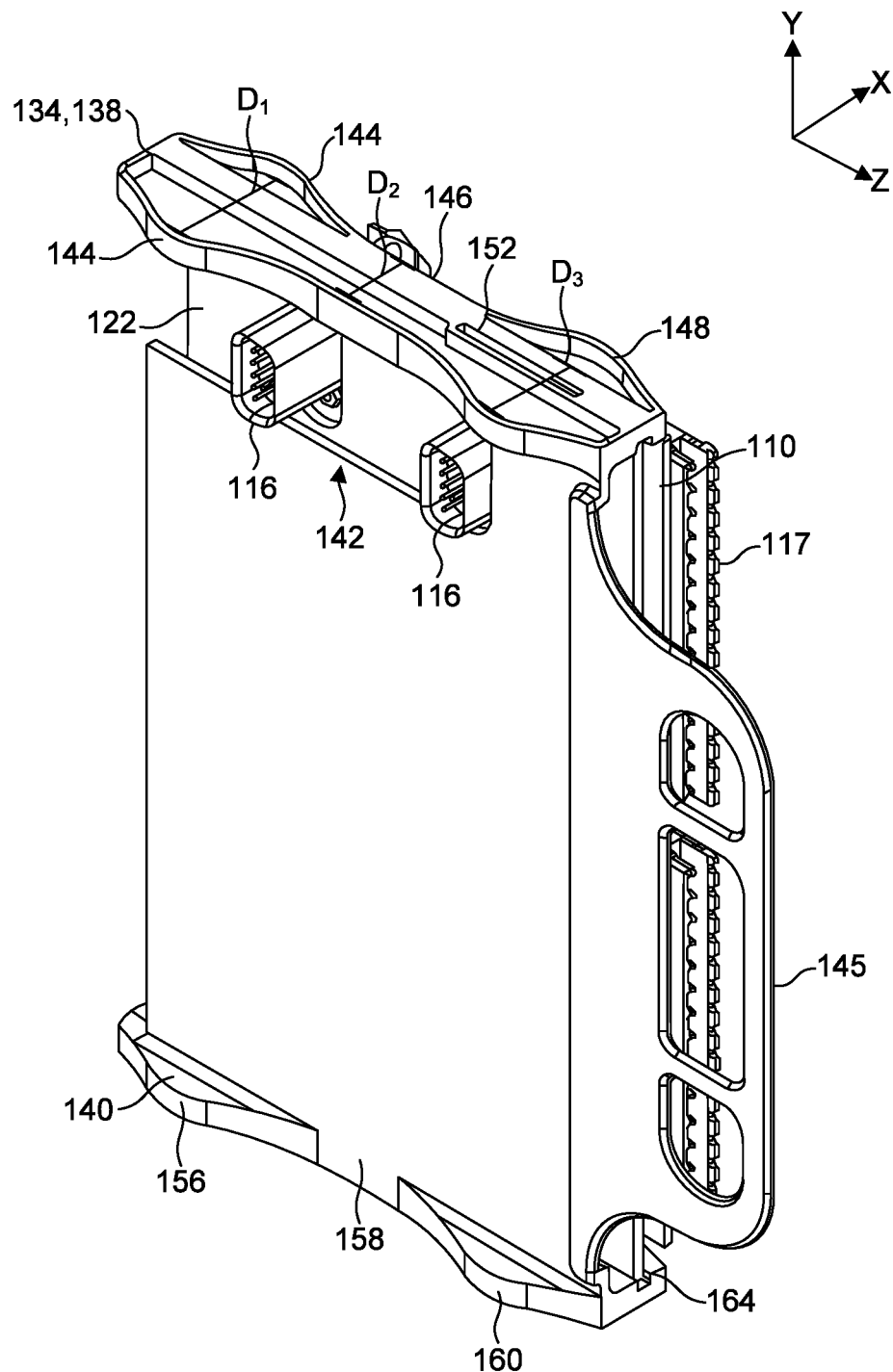
FIG. 6A is a perspective view illustrating one exemplary implementation of a disengagement slider assembly of the rackmount system of FIG. 1.
Figure 6B:
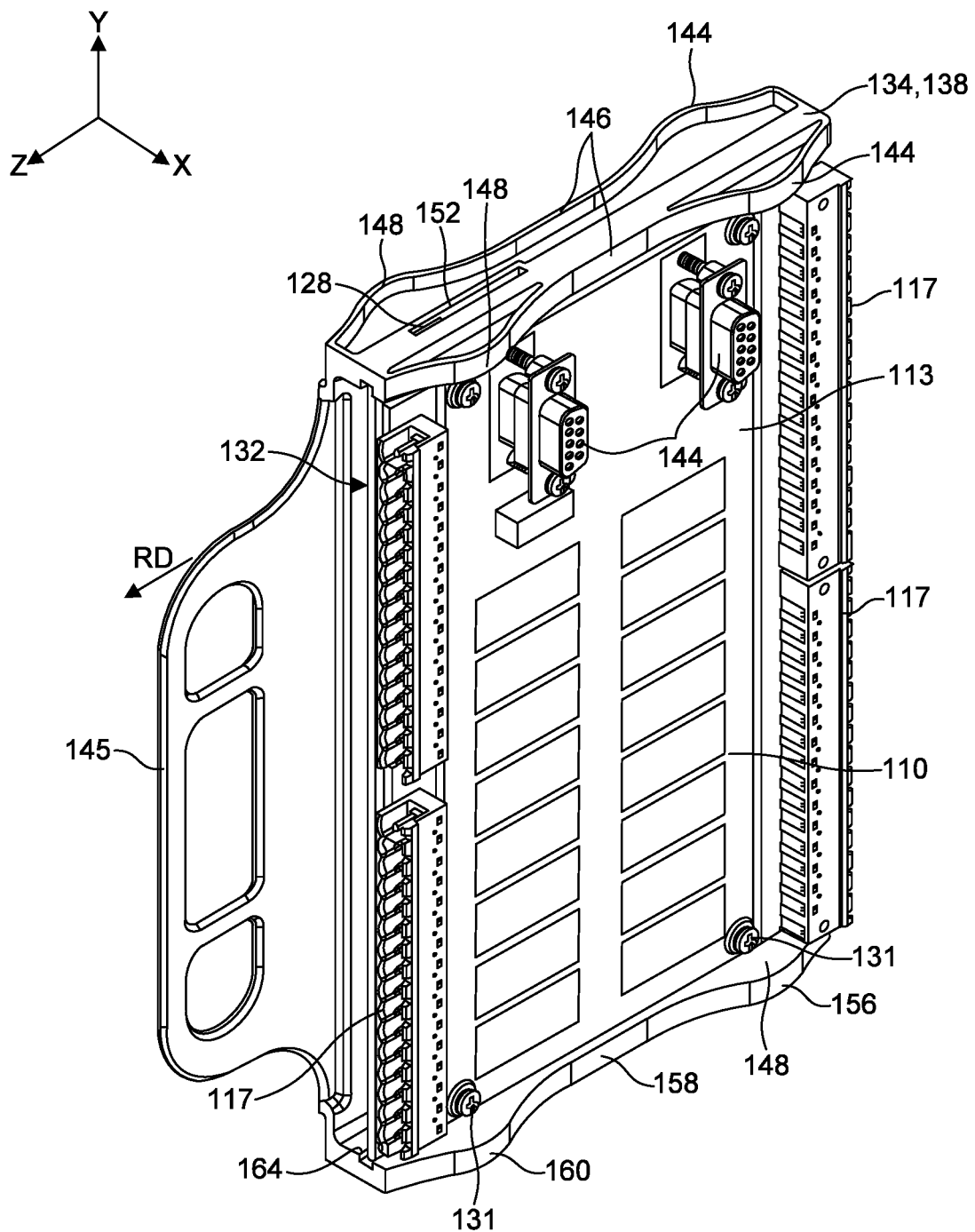
FIG. 6B is a perspective view illustrating the disengagement slider assembly of FIG. 6A.

The slots 152, 162 and the channel 164 allow for the base plate assembly 132 to be arranged within the disengagement slider 134 and slide along the Z-axis. FIGS. 6A-6B are perspective views illustrating one exemplary implementation of a disengagement slider assembly 170 of the rackmount system 100 of FIG. 1. The base plate assembly 132 can be arranged within the disengagement slider 134 in order to form the disengagement slider assembly 170. The top and bottom edges of the base plate 122 can be arranged within the channel of the top portion 138 and the channel 164 of the bottom portion 140. The tabs 128 of the base plate 122 can be arranged in the slot 152 of the top portion 138 and the slot 162 of the bottom portion 140. The tabs 128 can allow the base plate 122, with the PCB 110 attached, to be caught by the disengagement slider 134 when the disengagement slider is slid along the Z-axis in a removal direction. In an installed position, the tabs 128 are not abutting the ends of the slots 152, 162. However, during a removal of the disengagement slider assembly 170, the disengagement slider 134 is pulled along the Z-axis in the removal direction RD, which allows the disengagement slider 134 to move relative to the PCB 110 and the base plate 122 along the Z-axis. As the disengagement slider 134 moves relative to the base plate 122, the slots 152, 162 move along the tabs 122 until the tabs 122 reach the ends of the slots 152, 162. As the tabs 122 abut the ends of the slots 152, 162, the base plate 122 will then also begin to slide in the removal direction RD along the Z-axis, with the PCB 110 attached to the base plate 122.

Figure 7:
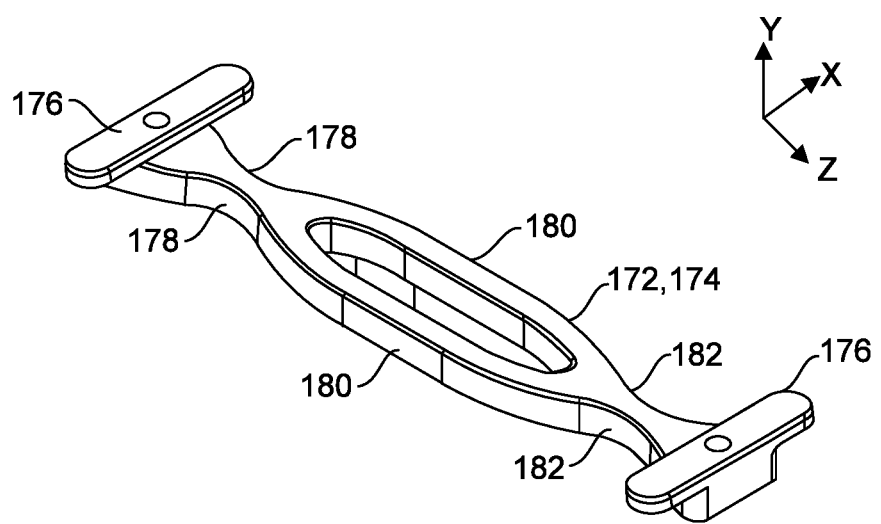
FIG. 7 is a perspective view illustrating one exemplary implementation of a separator of the rackmount system of FIG. 1.

In addition to allowing easy removal of a PCB 110 from the frame 102 via the disengagement slider 134, the rackmount system 100 can also disconnect the PCB 110 being removed from the adjacent PCBs 110 on either side of the removed PCB 110. The removal of the PCB 110 and the disconnecting of the PCB 110 can be accomplished through one sliding motion along the Z-axis. FIG. 7 illustrates one exemplary implementation of a separator 172 of the rackmount system 100 of FIG. 1. The separator 172 can be arranged between adjacent disengagement slider assemblies 170 within the frame 102 of the rackmount system 100. The separator 172 can include tabs 176, which can be arranged within the channels 109A, 109B of the top plate 108 of the frame 102, to allow the separator 172 to slide within the channels 109A, 109B. The separator 172 can also include a cam surface 174, which can interact with the cam surfaces 143, 154 of the disengagement slider 134. The cam surface 174 can include indentations 178, linear surfaces 180, and indentations 182. The linear surfaces 180 can be arranged between the indentations 178 and the indentations 182 along the Z-axis.

Figure 8:
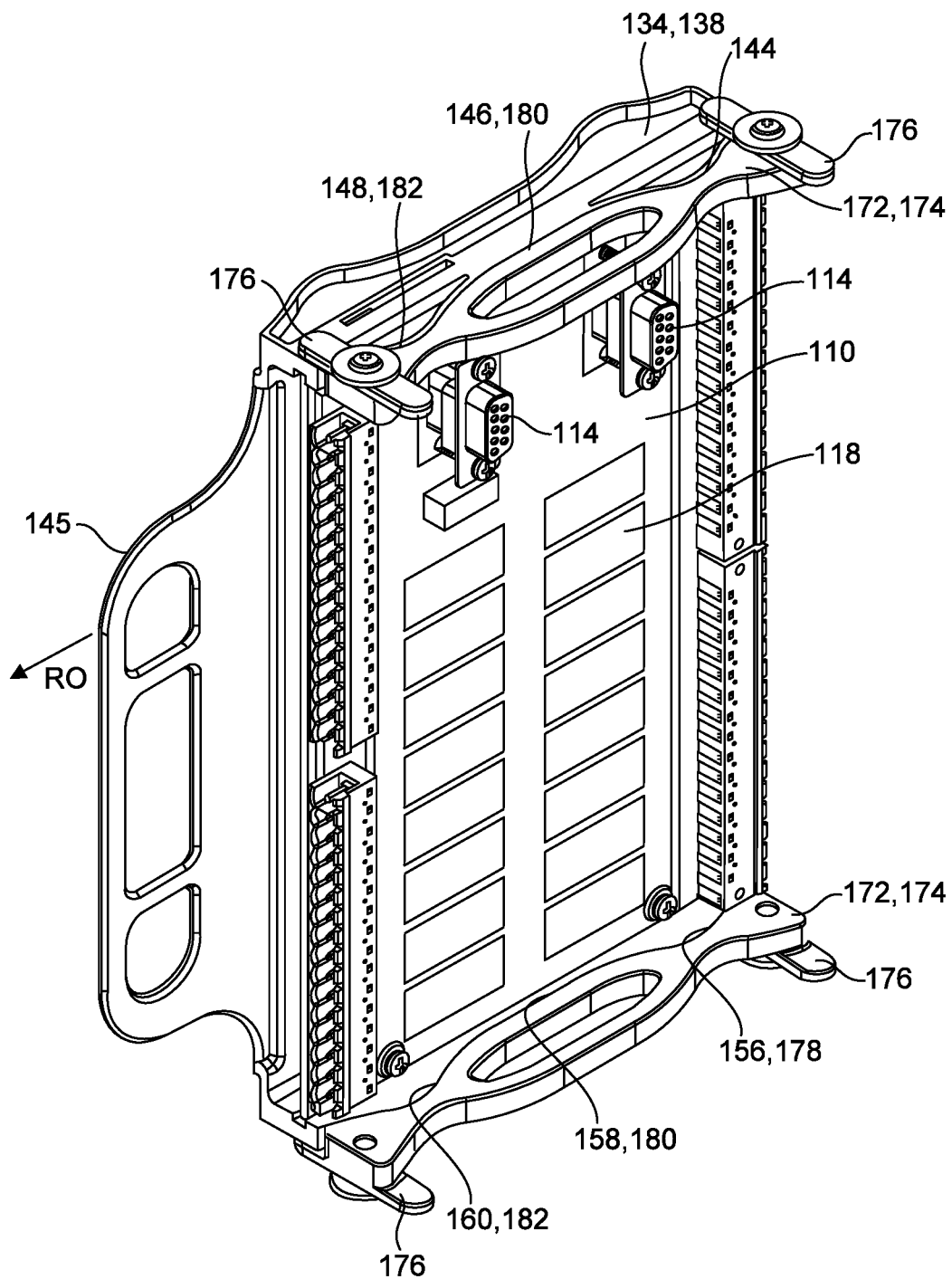
FIG. 8 is a perspective view illustrating the disengagement slider assembly of FIG. 6A interacting with the separator of FIG. 7.

In exemplary implementations, the separator 172 can be designed to nest with the top portion 138 and the bottom portion 140 of the disengagement slider 134. FIG. 8 illustrates the disengagement slider assembly 170 of FIG. 6A interacting with the separator 172 of FIG. 7. As depicted in FIG. 7, the projections 144, 148, 156, 160 nest within the indentations 178, 182 of the separators 172 in an installed position. Additionally, the linear surfaces 146, 158 abut the linear surfaces 180 in an installed position. Due to the location of the projections 144, 148, 156, 160 and indentations 178, 182, the connectors 114, 116 of adjacent PCBs 110 are connected to one another since adjacent PCBs 110 are the closest to each other along the X-axis in an installed position.

Figure 9:
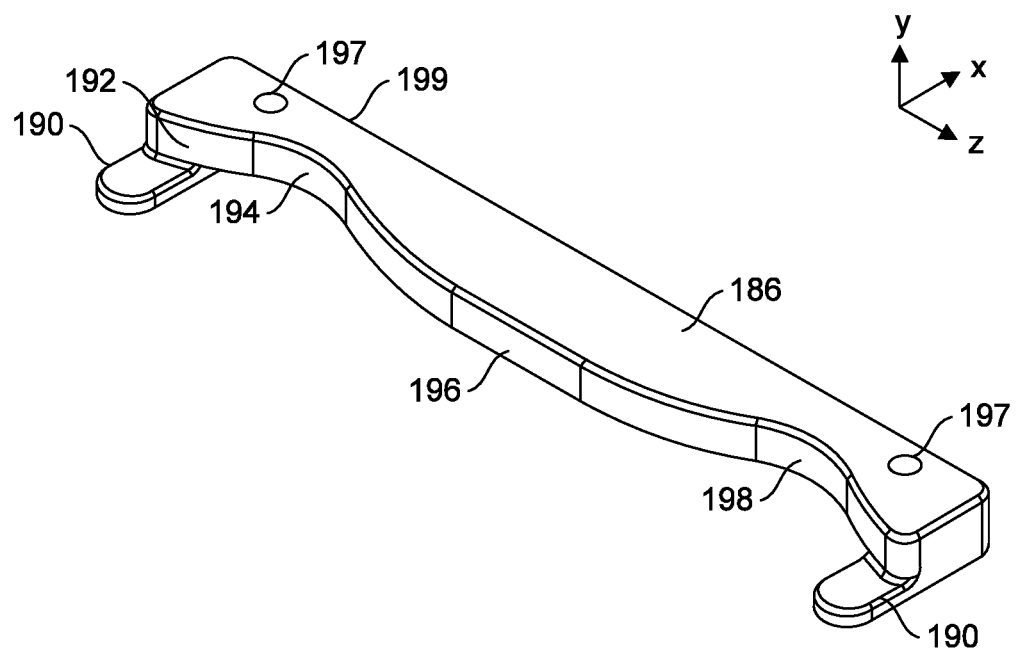
FIG. 9 is a perspective view illustrating one exemplary implementation of a stopper of the rackmount system of FIG. 1.

FIG. 9 illustrates one exemplary implementation of a stopper 186 of the rackmount system 100 of FIG. 1. The stopper 186 is substantially similar to only half of a separator 172, and is arranged at the end of the frame 102. The stopper 186 does not move linearly within the channels 109A, 109B during a removal of a PCB 110, unlike the disengagement slider assemblies 170 and separators 172 which can slide within the channels 109A, 109B. The stopper 186 can include tabs 190, which can allow the stopper 186 to be secured within the channels 109A, 109B. The stopper 186 can also include a cam surface 192, including an indentation 194, a linear surface 196, and an indentation 198. The projections 144, 148, 156, 160 nest within the indentations 194, 196, and the linear surfaces 146, 148 abut the linear surface 196 in an installed position. The cam surface 192 can be used to produce the same interactions as the separators 172 on disengagement slider assemblies 170 during removal and reinstallation. In an exemplary implementation, the stopper 186 can also include mounting holes 197 and/or other fastening mechanisms to secure the stopper 186 to the frame 102. The stopper 186 can be used to modify the number of PCBs 110 in a system by extending or limiting the channel lengths and available footprint within the frame 102. The tabs 190 can be used to plug the end of the channels 109A, 109B.

Figure 10:
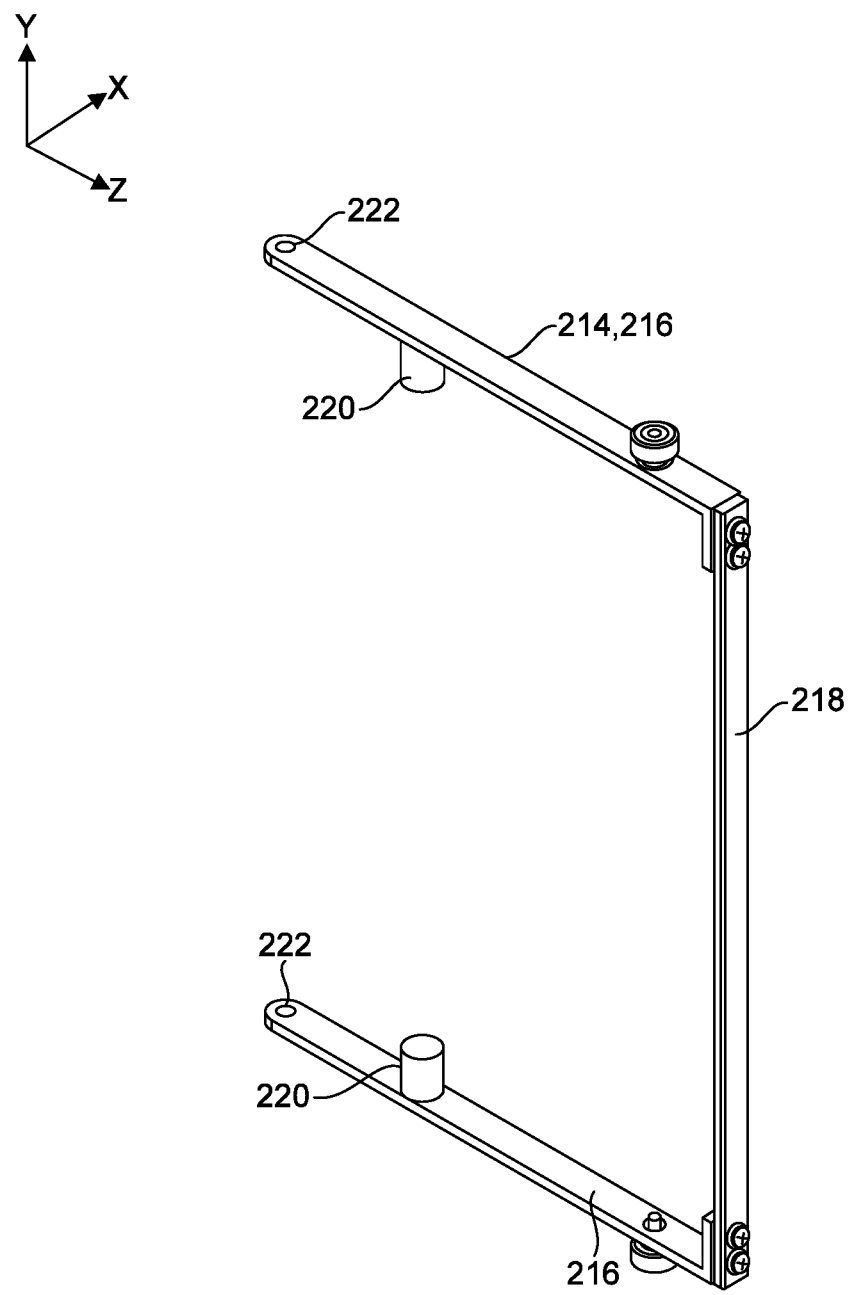
FIG. 10 is a perspective view illustrating one exemplary implementation of a compression handle of the rackmount system of FIG. 1.
Figure 11:
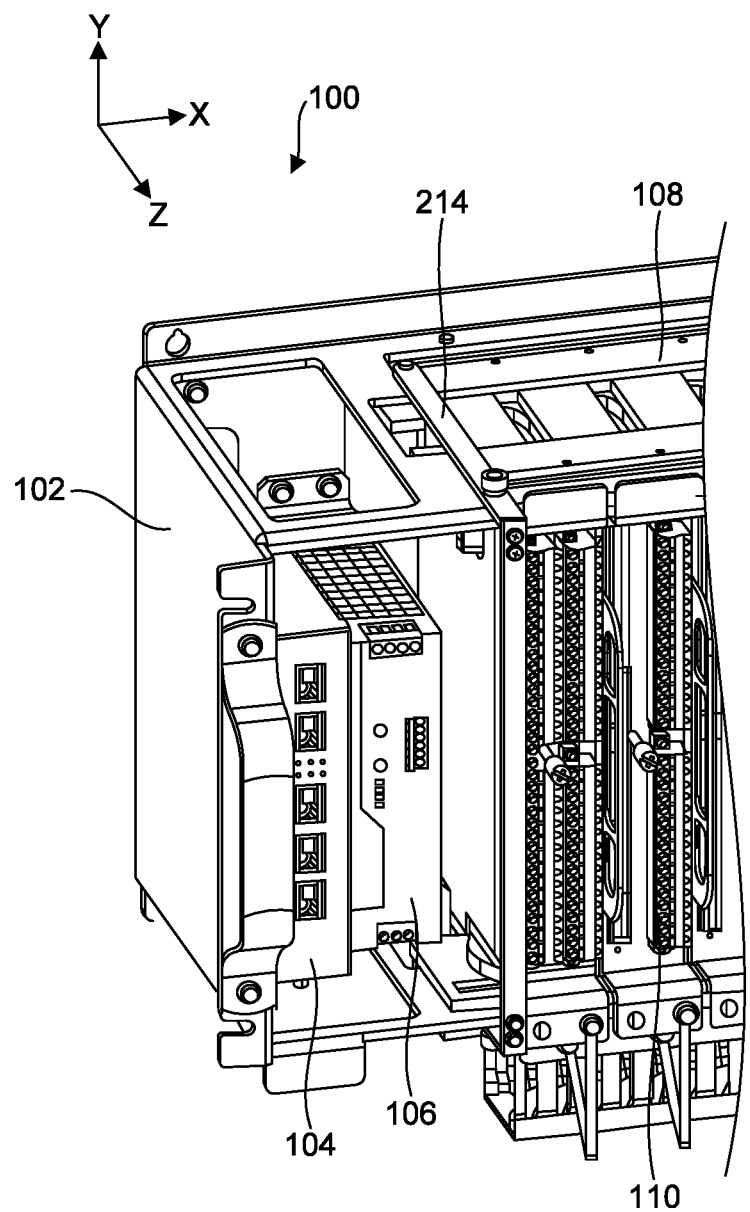
FIG. 11 is a partial perspective view illustrating the rackmount system of FIG. 1.

FIG. 10 illustrates one exemplary implementation of a compression handle 214 of the rackmount system 100. The compression handle 214, similar to the compression handle 115, is used to compress the plurality of disengagement slider assemblies 170 and separators 172 along the X-axis within the frame 102. The compression handle 214 can include portions 216 connected by a handle 218. Tabs 220 are arranged on the portions 216 and extend inward along the Y-axis in order to contact the first disengagement slider assembly 170 and/or the tabs 176 arranged within the frame 102. The screws 222 secure the compression handle 214 to the frame 102 and allow the compression handle 214 to pivot at the screws 222. As depicted in FIG. 11, in order to increase compression of the disengagement slider assemblies 170, the compression handle can be pivoted towards the disengagement slider assemblies 170 to compress them all together within the frame. In order to remove a PCB 110 from the frame, the compression handle 214 can be pivoted away from the disengagement slider assemblies 170 to allow the disengagement slider assemblies 170 and separators 172 to slide within the channels 109A, 109B.

Figure 12A:
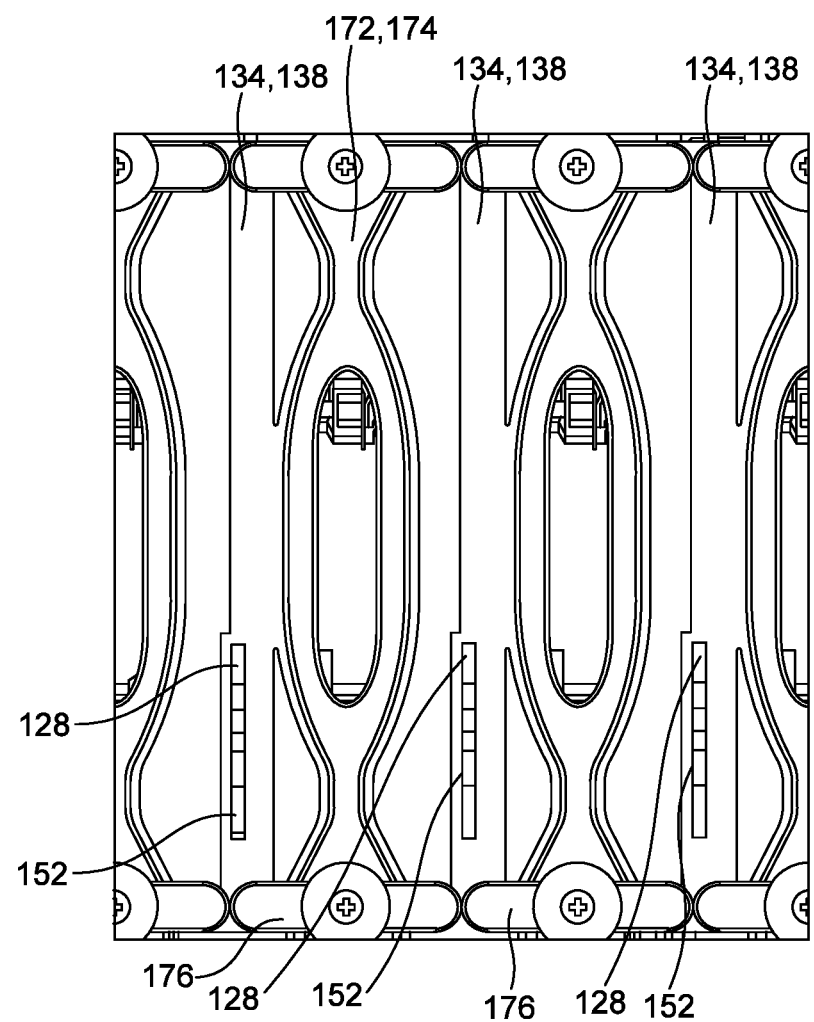
FIG. 12A is a partial top view illustrating the rackmount system of FIG. 11.
Figure 12B:
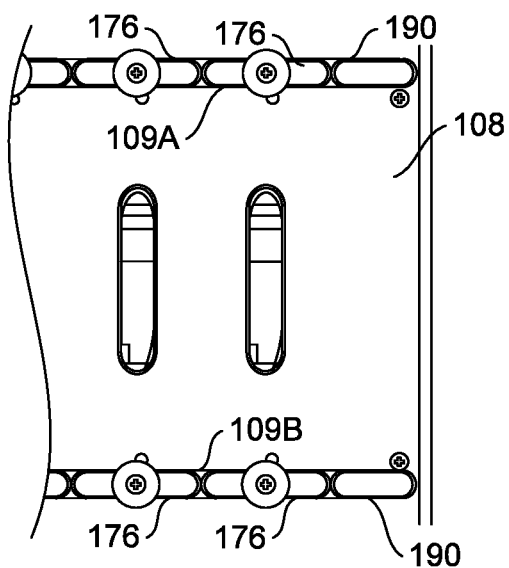
FIG. 12B is a partial top view illustrating the rackmount system of FIG. 11.

FIGS. 12A-12B illustrate a plurality of disengagement slider assemblies 170 and separators 172 in an installed position within the frame 102. The top plate 108 has been removed in FIG. 12A for clarity. As depicted in the FIGS. 12A-12B, the top portions 138 of the disengagement sliders 134 nest within adjacent separators 172 in order to minimize the distance between adjacent disengagement slider assemblies 170 so that the PCBs 110 of the adjacent disengagement slider assemblies 170 can communicatively connect to one another via connectors 114, 116. Additionally, as depicted in the figure, the tabs 128 of the baseplate assemblies 132 are arranged within the slots 152 of the disengagement sliders 134.

Figure 13:
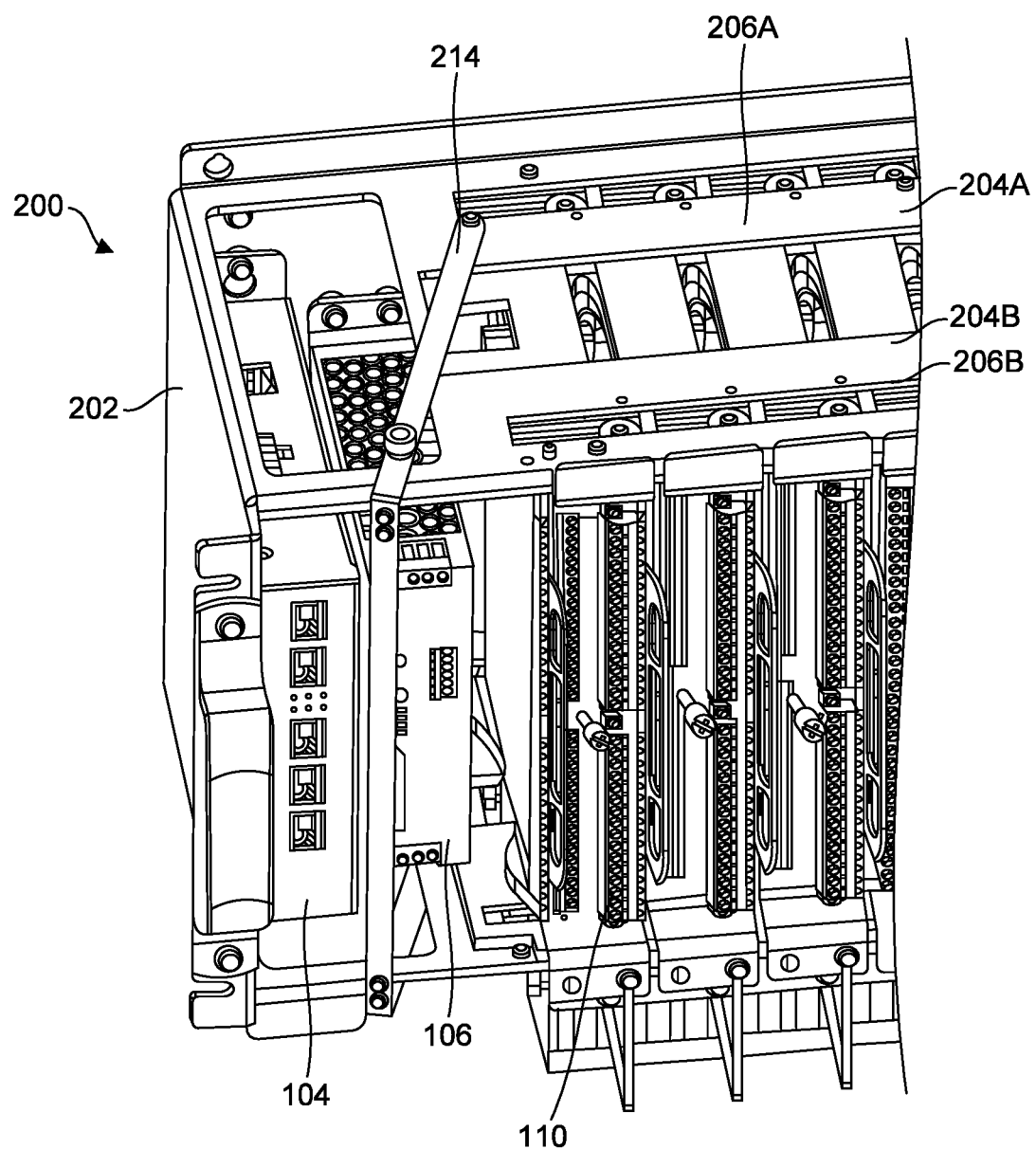
FIG. 13 is a partial perspective view illustrating another exemplary implementation of a rackmount system.

Instead of a base plate 108, the frame can include other structures to form channels to allow the separators 172 to slide within the frame during a removal procedure. For example, in an exemplary implementation, instead of including channels directly in the frame 102, the channels can be formed in separate plastic parts that are then mounted to the frame 102. Even further, FIG. 13 illustrates another embodiment of a rackmount system 200. The rackmount system 200 includes a frame 202, which is substantially similar to the frame 102. However, the frame 202 includes top rail 204A having channel 206A, and top rail 204B, having top rail 206B. The top rail 204A can be spaced apart from the top rail 204B along the Z-axis. As depicted in the figure, in order to begin a removal process of a PCB 110 from the frame 202, the compression handle 115 can be pivoted away from the first disengagement slider 134 in the frame 202.

Figure 14A:
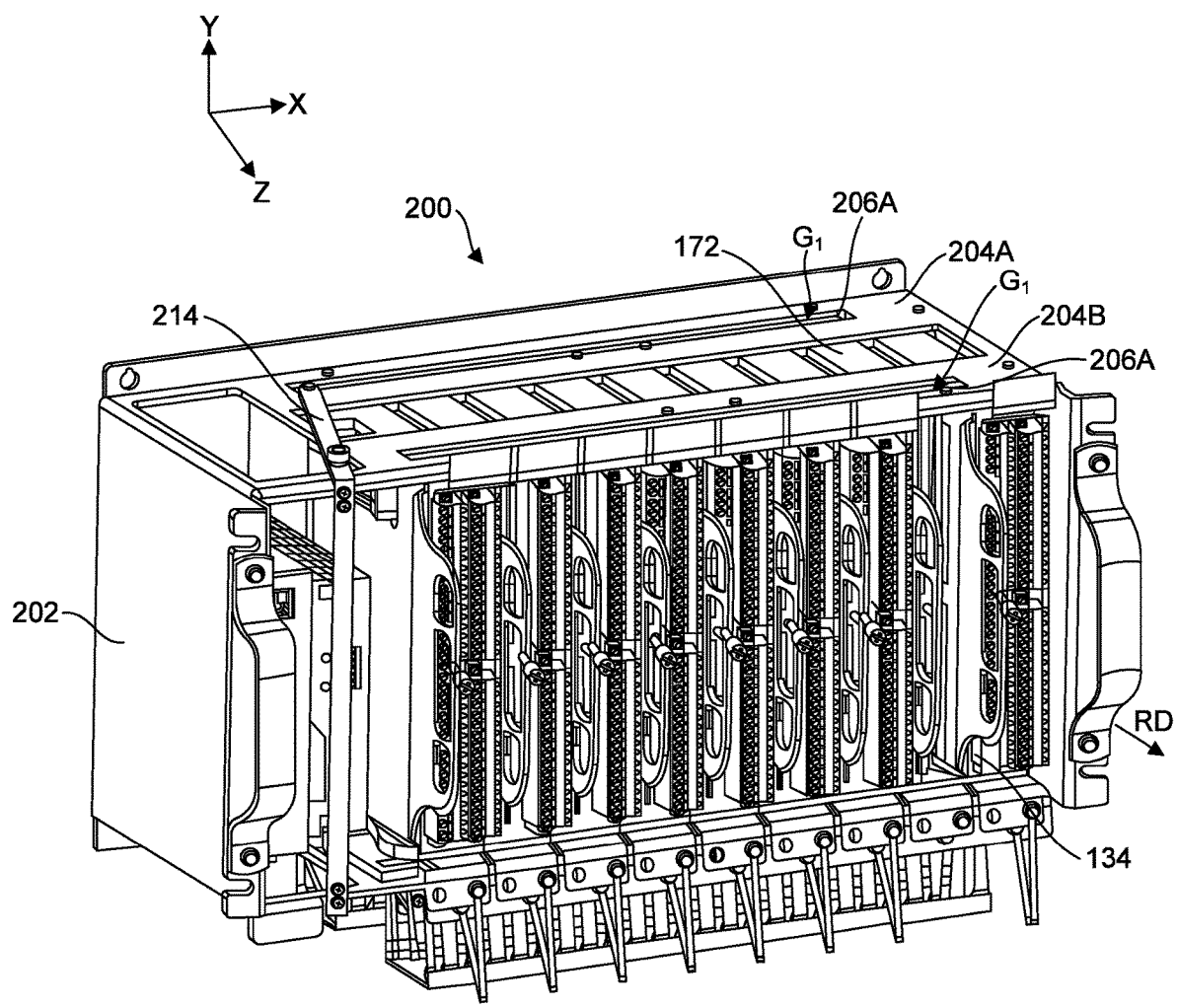
FIG. 14A is a perspective view illustrating a disengagement slider assembly removal from the rackmount system of FIG. 13.
Figure 14B:
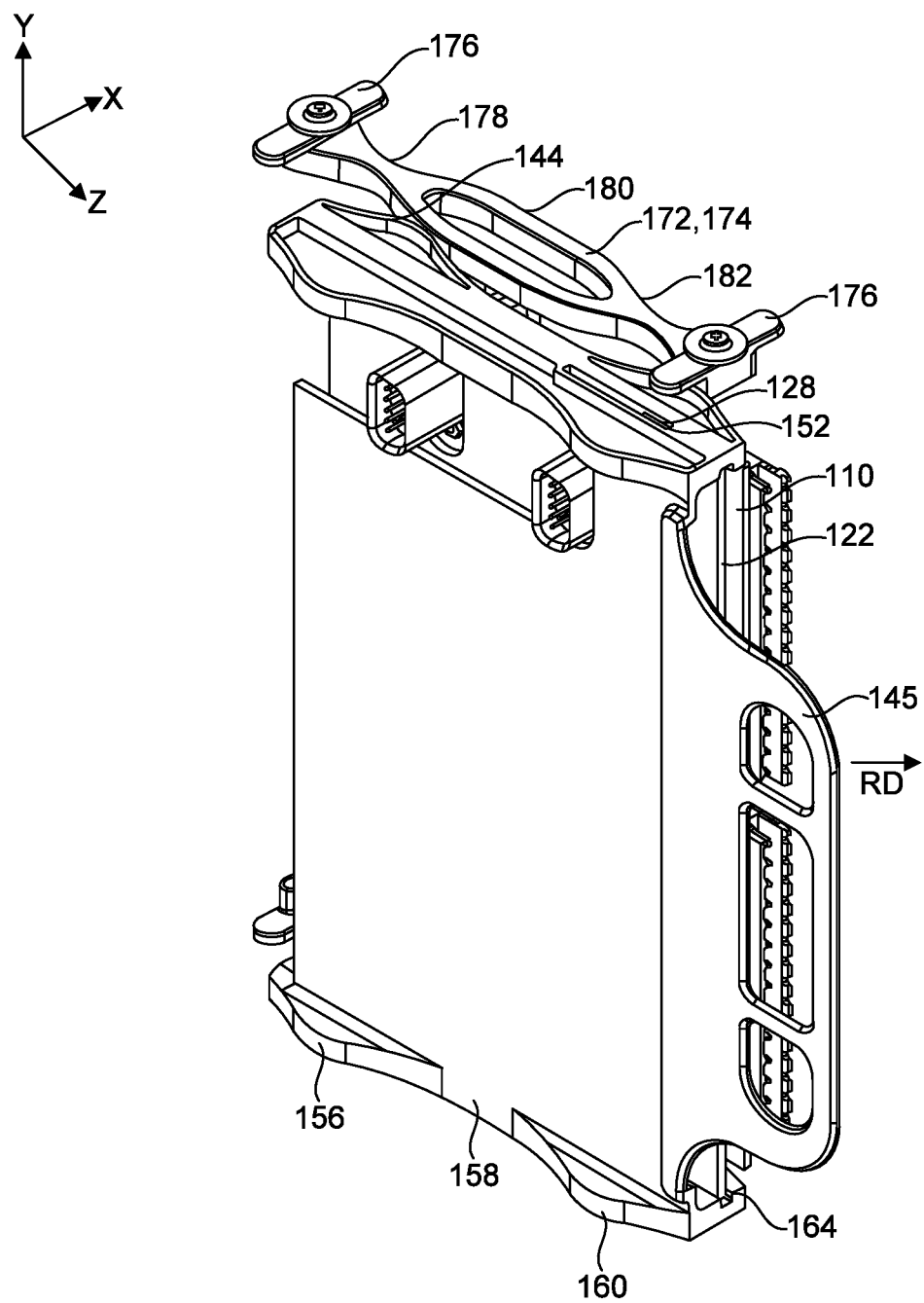
FIG. 14B is a perspective view further illustrating the disengagement slider assembly removal of FIG. 14A.

With the compression handle 115 pivoted to reduce the compression on the disengagement slider assemblies 170 and separators 172, the separators 172 can slide within channels 206A, 206B. FIGS. 14A-14B illustrates the removal of a disengagement slider assembly 170 from the rackmount system 200. To begin, the disengagement slider 134 can be slid in a removal direction RD along the Z-axis. As the disengagement slider 134 begins to move in the removal direction RD the cam surfaces 143, 154 of the disengagement slider 134 begin to slide along and relative to the cam surfaces 174 of the separators 172. As depicted in FIG. 14B, the projections 144 begin to abut against the linear surface 180 of the separator 172. This contact of the projections 144 with the linear surface 180 cause a gap $G_1$ to form between separators arranged in the channels 206A, 206B. The gap $G_1$ is representative of the separators 172 sliding along the channels 206A, 206B in order to create enough space between disengagement slider assemblies 170 to disconnect adjacent PCBs 110 and to slide the PCB 110 from the frame 202.

Figure 15A:
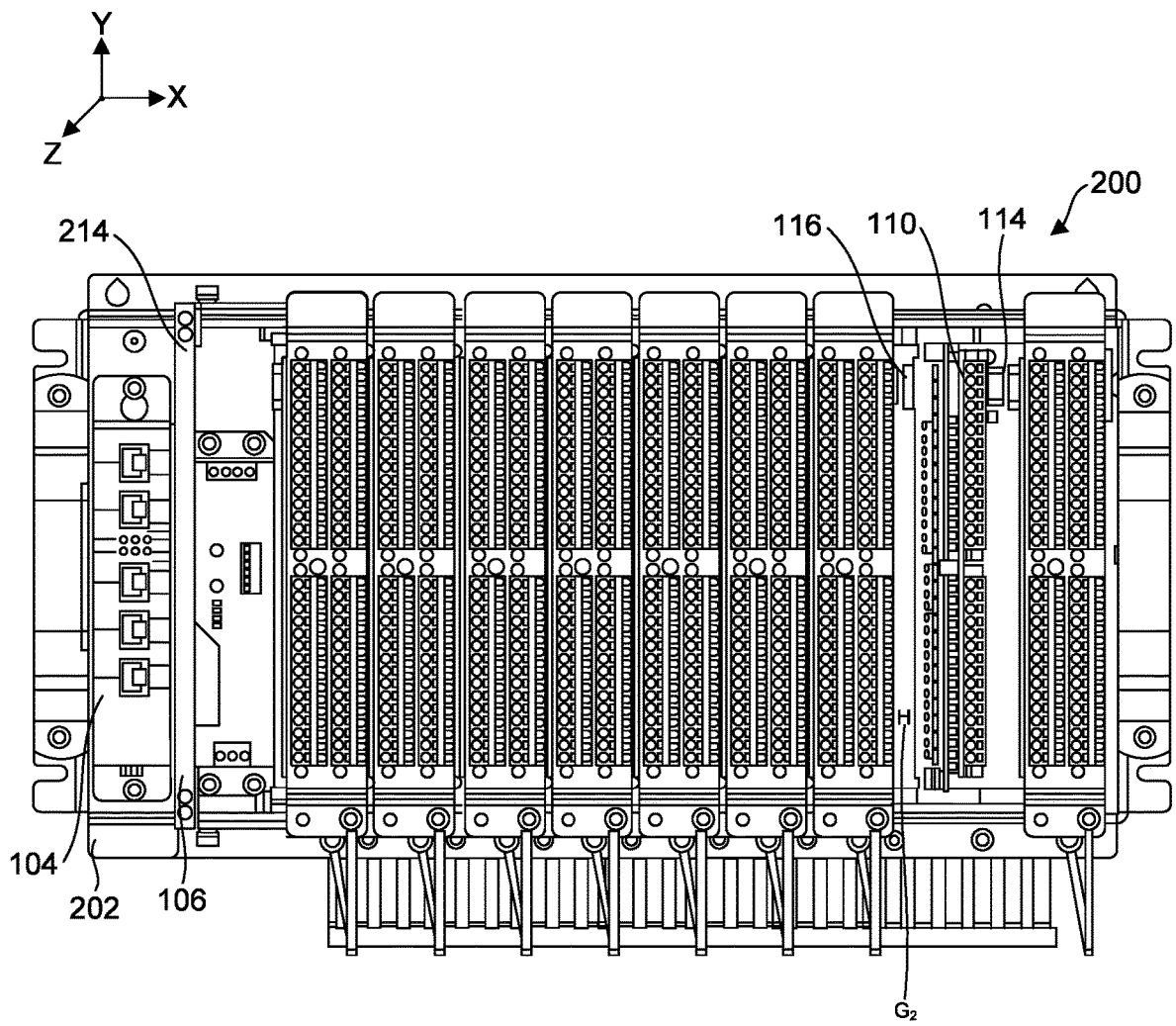
FIG. 15A is a front view illustrating the disengagement slider assembly removal from the rackmount system of FIG. 13.
Figure 15B:
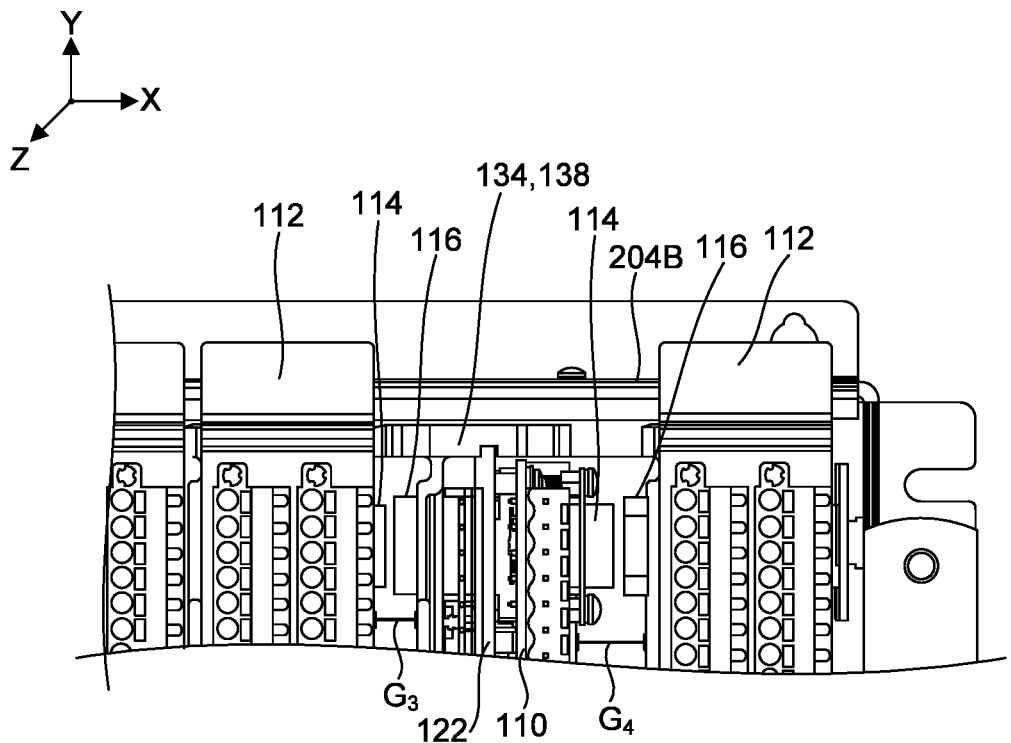
FIG. 15B is a front view further illustrating the disengagement slider assembly removal of FIG. 15A.

FIGS. 15A-15B illustrate front views of frame 202 during the removal procedure of a disengagement slider assembly 170. As the disengagement slider is pulled further in the removal direction RD, a gap $G_2$ between adjacent disengagement slider assemblies 170 will continue to increase. The gap $G_2$ will increase until the maximum projection of the projection 144 is contacting the linear surfaces 180 of the separator 172. As depicted in FIG. 15B, a gap $G_3$ can form on one side of the PCB 110, and a gap $G_4$ can from on the opposite side of the PCB 110. In an exemplary implementation, the gaps $G_3$ and $G_4$ can be identical due to the symmetrical design of the disengagement slider 134. Once the projections 144 are fully in contact with the linear surfaces 180, the gaps $G_3$ and $G_4$ are at their maximum length.

Figure 16:
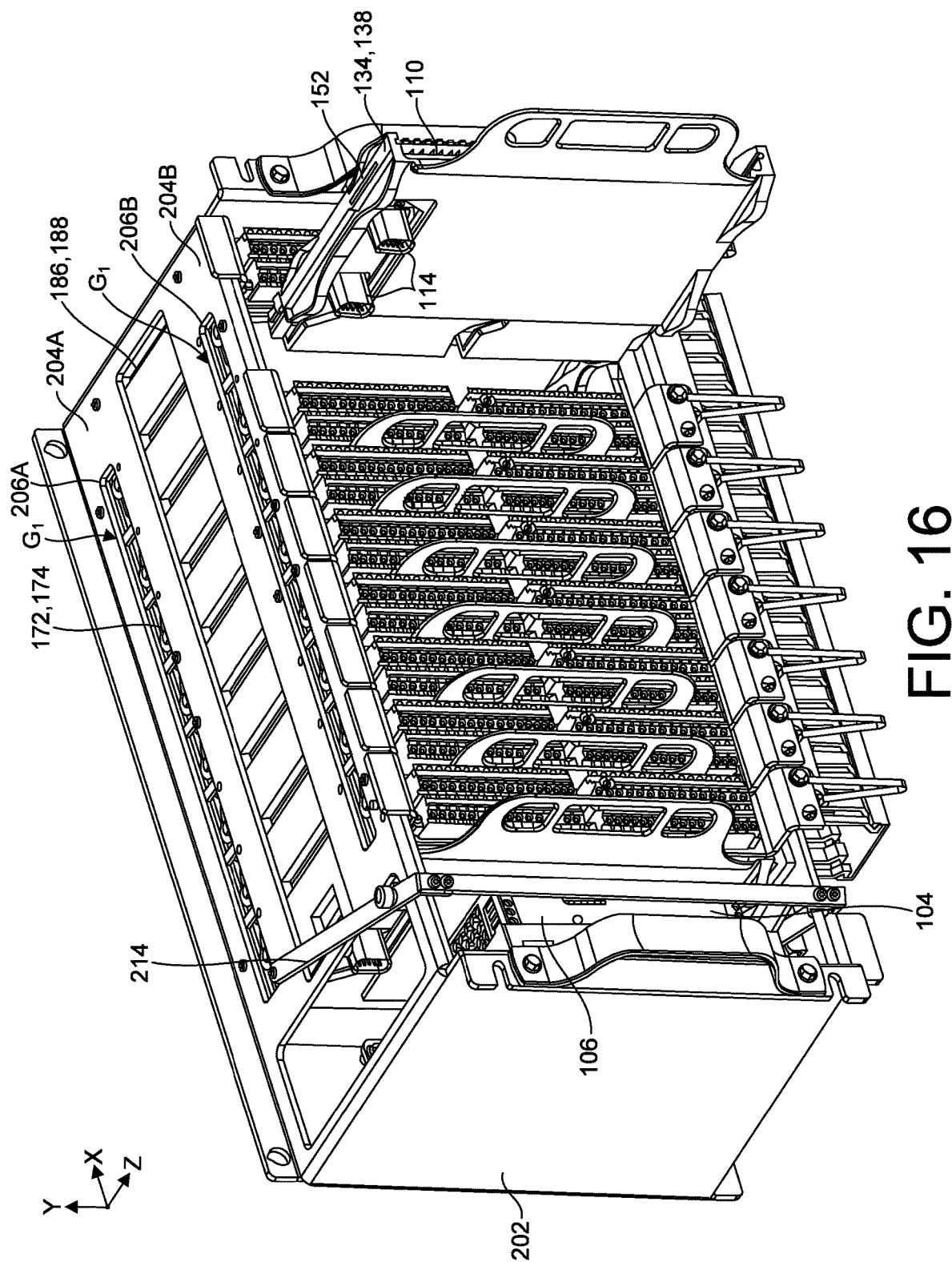
FIG. 16 is a perspective view illustrating the disengagement slider assembly removal from the rackmount system of FIG. 13.

At the maximum length, the connectors 114, 116 of adjacent PCBs 110 are disconnected from one another, allowing the disengagement slider assembly 170 to be pulled out of the frame 202 without disrupting the adjacent PCBs 110. FIG. 16 illustrates the disengagement slider assembly 170 being fully removed from the frame 202. With the disengagement slider assembly 170 fully removed from the frame 202, the PCB 110 can be replaced or repaired before being reinstalled within the frame 102, and then the compression handle 115 can be pivoted to push the disengagement slider assemblies 170 back together. In an exemplary embodiment, after a disengagement slider assembly 170 is removed from the frame 202, the remaining disengagement slider assemblies 170 can be slid back along the channels 206A, 206B in order to connect the PCBs 110 which were adjacent to the removed PCB 110 without reinstalling the removed disengagement slider assembly 170. The disengagement slider assemblies 170 and the separators 172 are slid into contact with each other by pivoting the compression handle 115 to contact the first disengagement slider assembly 170.

It is important to note that this removal procedure can be accomplished without turning off or deactivating the other PCBs 110 within the rackmount system 200. Each stacked PCB 110 receives power and data through the connectors 114, 116, starting with the PCB 110 adjacent to the power supply 106. Additionally, the PCB 110 furthest away from the power supply 106 is connected back to the controller 104 and power supply 106 through a cable connected to the open connector 114, 116 on the last PCB 110. Additionally, the process can be reversed to reinsert a PCB 110 into the frame 202, with a disengagement slider assembly 170 creating the gaps required between adjacent separators 172 to create enough space to insert the disengagement slider assembly 170. Once inserted, the compression handle 115 can be pivoted to connect the stacked PCBs 110.

Certain exemplary implementations have been described to provide an overall understanding of the principles of the structure, function, manufacture, and use of the systems, devices, and methods disclosed herein. One or more examples of these implementations have been illustrated in the accompanying drawings. Those skilled in the art will understand that the systems, devices, and methods specifically described herein and illustrated in the accompanying drawings are non-limiting exemplary implementations and that the scope of the present invention is defined solely by the claims. The features illustrated or described in connection with one exemplary implementation may be combined with the features of other implementations. Such modifications and variations are intended to be included within the scope of the present invention. Further, in the present disclosure, like-named components of the implementations generally have similar features, and thus within a particular implementation each feature of each like-named component is not necessarily fully elaborated upon.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

One skilled in the art will appreciate further features and advantages of the invention based on the above-described implementations. Accordingly, the present application is not to be limited by what has been particularly shown and described, except as indicated by the appended claims. All publications and references cited herein are expressly incorporated by reference in their entirety.

What is claimed is:

1. A system, comprising:
a frame including a plate with a channel arranged in the plate;

a disengagement slider including a mounting surface and a first portion including a first cam surface, wherein the disengagement slider is arranged within the frame; and a separator including a second cam surface and arranged in the channel of the plate, wherein the first cam surface and the second cam surface are nested with each other when the disengagement slider is in an inserted position, the disengagement slider being configured to slide the separator in the longitudinal direction when the disengagement slider is removed from the frame due to the interaction of the first cam surface with the second cam surface.

2. The system of claim 1, wherein the first cam surface includes a first protrusion and a second protrusion spaced apart from the first protrusion.

3. The system of claim 2, wherein the second cam surface includes a first indentation and a second indentation spaced apart from the first indentation.

4. The system of claim 3, wherein a first linear surface is arranged between the first and second protrusions, and a second linear surface is arranged between the first and second indentations.

5. The system of claim 4, wherein in an inserted position, the first projection of the disengagement slider is arranged within the first indentation of the separator and the second projection of the disengagement slider is arranged within the second indentation of the separator.

6. The system of claim 4, wherein in a removed position, the first cam surface is configured to slide along the second cam surface in a removal direction, and the first projection of the disengagement slider is configured to contact the second linear surface of the separator.

7. The system of claim 4, wherein when the first projection of the disengagement slider contacts the second linear surface of the separator, the separator is configured to contact and move a plurality of disengagement sliders and separators arranged on the opposite side of the separator from the disengagement slider in the longitudinal direction within the frame.

8. The system of claim 1, further comprising a printed circuit board including a first connector arranged on a first side of the printed circuit board and a second connector arranged on a second side of the printed circuit board, wherein the printed circuit board is mounted to a baseplate, wherein the baseplate is mounted to the mounting surface of the disengagement slider.

9. The system of claim 8, wherein the baseplate includes a tab arranged within a slot of the disengagement slider, and the tab abuts the disengagement slider within the slot when the disengagement slider is pulled in a removal direction.

10. The system of claim 1, wherein a plurality of printed circuit boards are each arranged on a plurality of disengagement sliders, wherein in the inserted position, the plurality of printed circuit boards are communicatively connected to each other via first connectors securing to adjacent second connectors of adjacent printed circuit boards, and in a removed position, a printed circuit board of the plurality of printed circuit boards arranged on a disengagement slider of the plurality of disengagement sliders being slid in a removal direction disconnects from adjacent printed circuit boards while the remaining plurality of printed circuit boards remain communicatively connected with each other via the first and second connectors.

11. A method, comprising:
sliding a disengagement slider in a removal direction out of a frame, wherein the disengagement slider includes a first cam surface;
sliding a separator in a first longitudinal direction within the frame, wherein the separator includes a second cam surface;
wherein the first cam surface and the second cam surface are nested with each other when the disengagement slider is in an inserted position, the disengagement slider being configured to slide the separator in the first longitudinal direction when the disengagement slider is slid in the removal direction due to the interaction of the first cam surface with the second cam surface.

12. The method of claim 11, further comprising decoupling a connector of a printed circuit board arranged on a baseplate when the separator is slid in the first longitudinal direction, wherein the baseplate is arranged on the disengagement slider.

13. The method of claim 12, wherein the first cam surface includes a first protrusion and a second protrusion spaced apart from the first protrusion.

14. The method of claim 13, wherein the second cam surface includes a first indentation and a second indentation spaced apart from the first indentation.

15. The method of claim 14, wherein in an inserted position, the first projection of the disengagement slider is arranged within the first indentation of the separator, the second projection of the disengagement slider is arranged within the second indentation of the separator, and a first linear surface of the disengagement slider is aligned with a second linear surface of the separator.

16. The method of claim 15, wherein in a removed position, the first cam surface is configured to slide along the second cam surface in the removal direction, and the first projection of the disengagement slider is configured to contact the second linear surface of the separator.

17. The method of claim 15, wherein when the first projection of the disengagement slider contacts the second linear surface of the separator, the separator is configured to contact and move a plurality of disengagement sliders and separators arranged on an opposite side of the separator from the disengagement slider in the first longitudinal direction within the frame.

18. The method of claim 12, wherein the baseplate includes a tab arranged within a slot of the disengagement slider.

19. The method of claim 18, wherein the tab abuts the disengagement slider within the slot when the disengagement slider is pulled in the removal direction.

20. The method of claim 11, further comprising:
sliding the disengagement slider in an installation direction into the frame, wherein the installation direction is opposite the removal direction;
pivoting a compression handle in order to abut an adjacent disengagement slider or an adjacent separator; and
sliding the separator in a second longitudinal direction within the frame, wherein the second longitudinal direction is opposite the first longitudinal direction.

* * * * *